US007953183B2

(12) United States Patent
Shridhar et al.

(10) Patent No.: US 7,953,183 B2
(45) Date of Patent: May 31, 2011

(54) SYSTEM FOR HIGH DEFINITION RADIO BLENDING

(75) Inventors: Vasant Shridhar, Bloomfield, MI (US); Mark Spellman, Novi, MI (US); Nicolai Pavlov, Commerce, MI (US)

(73) Assignee: Harman International Industries, Incorporated, Northridge, CA (US)

( * ) Notice: Subject to any disclaimer, the term of this patent is extended or adjusted under 35 U.S.C. 154(b) by 787 days.

(21) Appl. No.: 11/454,997

(22) Filed: Jun. 16, 2006

(65) Prior Publication Data

US 2007/0291876 A1 Dec. 20, 2007

(51) Int. Cl.
*H03K 9/00* (2006.01)
*H04B 3/46* (2006.01)

(52) U.S. Cl. ......................... 375/316; 375/227; 375/259

(58) Field of Classification Search .................. 375/320, 375/316, 259

See application file for complete search history.

(56) References Cited

U.S. PATENT DOCUMENTS

| | | | | |
|---|---|---|---|---|
| 4,491,975 | A * | 1/1985 | Ito | 455/166.1 |
| 7,546,088 | B2 | 6/2009 | Kroeger et al. | 455/60 |
| 2001/0005402 | A1 * | 6/2001 | Nagatani et al. | 375/296 |
| 2004/0043730 | A1 | 3/2004 | Schill et al. | 455/130 |
| 2004/0235440 | A1 * | 11/2004 | Toporski et al. | 455/150.1 |
| 2004/0261132 | A1 | 12/2004 | Shimizu | 725/139 |
| 2006/0019601 | A1 * | 1/2006 | Kroeger et al. | 455/3.06 |
| 2006/0135098 | A1 * | 6/2006 | Yarosz et al. | 455/161.2 |
| 2006/0227814 | A1 | 10/2006 | Iannuzzelli | 370/516 |
| 2007/0086550 | A1 * | 4/2007 | Kaise | 375/348 |
| 2007/0293167 | A1 | 12/2007 | Shridhar et al. | 455/130 |

* cited by examiner

*Primary Examiner* — David Payne
*Assistant Examiner* — Brian J Stevens
(74) *Attorney, Agent, or Firm* — Brinks Hofer Gilson & Lione

(57) ABSTRACT

A system for blending a hybrid radio signal provides reduced volume level transitions during blending from an analog component of the hybrid signal to the digital component by adjusting blend and cross-fade variables, as well as setting a hysteresis mode to prevent undesirable jumping from digital mode back to analog mode sequentially. The system also compensates for digital AM frequency quality issues by adjusting a filter bandwidth when the transceiver blends the AM signal from analog to digital mode.

29 Claims, 5 Drawing Sheets

SYSTEM FOR HIGH DEFINITION RADIO BLENDING

BACKGROUND OF THE INVENTION

1. Technical Field

This invention relates to radio spectrum blending. In particular, this invention relates to high definition (HD) radio blending.

2. Related Art

Digital information may be transmitted using frequency division multiplexing (FDM), a modulation method that has been used in a number of different digital television and radio systems, including digital video broadcasting for television (DVB-T). In a hybrid mode of high definition (HD) radio, the amplitude modulation (AM) version may carry 36 kilobits per second of data for the main audio channel, while frequency modulation (FM) stations may carry information at 96 kbit/s. HD radio may also be used to carry multiple distinct audio services, called multicasting. Secondary channels, such as for weather, traffic, or a radio reading service, may be added this way, though it may reduce the audio quality of all channels on a station. Datacasting is also possible, and radio data system (RDS)-like metadata about the program and station may be included in the standard signal.

Another limitation of HD radio is the blending process. In hybrid mode, a radio may lock onto an analog signal first, then try to find a better quality digital signal. If the digital signal is lost, the receiver may blend to analog. Much of the success of this blending relies on proper synchronization of the analog and digital audio signals by the broadcaster at the transmitter. This fallback process may also be impeded by the use of multiple channels.

Another limitation of conventional HD radio blending is the switching back and forth between an analog and a digital signal, which may result in sudden loudness changes perceived by the listener. If the listener is passing through a region of varying digital signal strength, this change may occur often, resulting in a decreased audio experience. For an AM HD radio signal, the blend from analog to digital may also result in an expansion of frequency content in the received signal. This frequency widening may result in a poor sounding signal perceived by the listener. Therefore a need exists for an HD radio blending algorithm that reduces analog-digital switching drawbacks.

SUMMARY

A tuning device for blending an FM hybrid digital radio signal may reduce loudness variations due to blending from analog to digital signals in a hybrid radio signal. The tuning device may lock onto an analog component of the signal. The tuning device may initialize blend variables, attempt to acquire a digital component of the signal, and blend to the digital signal if present. The tuning device may monitor the signal quality, and may set a transceiver in a hysteresis mode for a period if only an analog component is present, to prevent sudden transitions between digital and analog components of the hybrid signal. If the digital component is present in the hybrid radio signal, and a quality parameter is greater than or equal to a determined threshold, the tuning device may lower a cross-fade rate and blend threshold. If the quality parameter is less than a threshold value, the tuning device may reset the cross-fade rate and blend threshold.

A tuning device that blends an AM hybrid digital radio signal may provide a loudness transition reduction along with an enhanced bandwidth adjustment during blending from analog to digital signals in a hybrid signal. The tuning device may lock onto an analog component of the signal, initialize blend variables, attempt to acquire a digital component of the signal, and blend to the digital signal if present. The tuning device may set a timer to gradually increase a bandpass bandwidth from an analog bandwidth to a digital bandwidth, as the bandwidth in an AM digital signal increases in the blend from analog to digital mode. The tuning device may increase the filter bandwidth to compensate for this bandwidth broadening until the filter bandwidth equals the digital bandwidth. The tuning device may then monitor the signal quality, and set the transceiver in a hysteresis mode for a period if only an analog component is present. If the digital component is present in the hybrid radio signal, and a quality parameter is greater than or equal to a determined threshold, the tuning device may lower a cross-fade rate and blend threshold. If the quality parameter is less than a threshold value, the tuning device may reset the cross-fade rate and blend threshold.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

A system that blends HD radio may provide improved sound quality perceived by the listener for AM and FM HD radio by adjusting the rate of blending from an analog signal to a digital signal and vice versa. The system may also provide improved sound quality for AM HD radio by increasing a filter bandwidth when an analog to digital blend occurs for an AM HD radio signal.

An HD radio AM in-band, on-channel (IBOC) system may support transmission of digital audio and auxiliary digital data within an existing AM channel allocation by placing groups of digitally modulated carrier signals, such as within and adjacent to an analog AM signal. Because digitally modulated carriers are inserted within the same spectrum occupied by the analog AM signal, the AM IBOC system may not be compatible with analog AM stereo signals. Corresponding sideband groups on either side of the carrier (i.e., upper primary and lower primary) may be independent in that only one of them may be needed for an IBOC receiver to be able to generate digital audio. However, to generate stereo (or enhanced fidelity) digital audio, the secondary and tertiary sideband groups may be needed.

Orthogonal frequency division multiplexing (OFDM) modulation may be utilized in the AM IBOC system. The digital audio modulated onto OFDM carriers may be perceptually coded, allowing for high-quality digital audio using a relatively low bit rate. At the transmission site, an audio coder may create two audio streams—a "core" stream and an "enhanced" stream—and the system may assign the streams to different parts of the spectrum. The core stream may carry monaural audio and the enhanced stream, at the broadcaster's option, may carry enhanced fidelity stereo audio.

The audio bandwidth for the digital audio may be approximately 15 kHz. The AM IBOC signal may incorporate a 4-½ s delay between the analog and digital (simulcast) audio signals to improve performance in the presence of certain types of interference, which may affect how broadcasters monitor off-air signals.

An HD radio FM IBOC system may support transmission of digital audio and auxiliary digital data within an existing FM channel allocation by placing two groups of digitally modulated carrier signals adjacent to an analog FM signal. These sideband groups may be independent in that only one group may be needed for an IBOC receiver to be able to generate digital audio. Orthogonal frequency division multiplexing (OFDM) modulation may be utilized. The digital audio modulated onto OFDM carriers may be perceptually coded, allowing for high-quality digital audio using a relatively low bit rate. The system may incorporate a 4-½ second delay between the analog and digital (simulcast) audio signals to improve performance in the presence of certain types of interference, which may affect how broadcasters monitor off-air signals.

Figure 1:
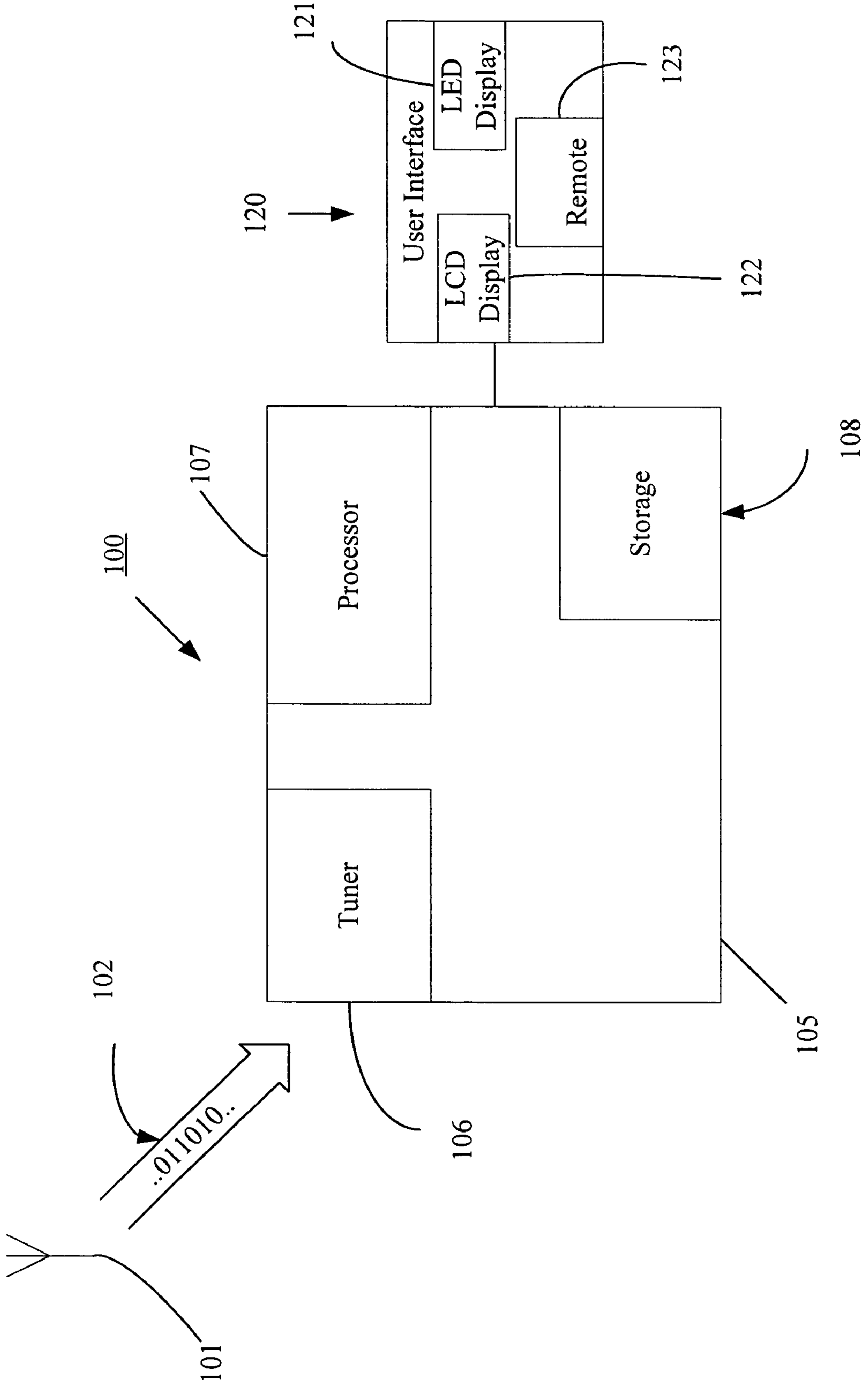
FIG. 1 illustrates an example high definition radio system.

FIG. 1 illustrates an example HD radio system 100. A transmitter 101 may transmit a radio signal, such as an HD radio signal 102. The HD radio signal 102 may include both an analog radio signal and a digital radio signal. The HD radio signal 102 may be amplitude modulated (AM) or frequency modulated (FM). The HD radio system 100 includes a transceiver 105 that may be configured to receive analog and digital AM and FM radio signals. The transceiver 105 may be further configured to receive HD radio AM and FM radio signals, such as the HD radio signal 102, broadcast over a medium, such as over-the-air broadcast. The transceiver 105 may further include a tuner module 106 that decodes and/or processes the received radio signals. The transceiver 105 may also include an HD radio processor 107 that may process the received HD radio signals. The transmitter 101 may include a terrestrial ground antenna, a balloon or a dirigible-mounted antenna, or other aerial mounted antenna.

The HD radio system 100 may include a user interface 120, coupled with the transceiver 105. The user interface 120 may include a first display 121, a second display 122, and a remote interface 123. The first display 121 may include a light emitting diode (LED), and/or the second display 122 may include a liquid crystal display (LCD), and may provide information to a user about the HD radio system 100, such as channel tuning, volume, radio signal information (for example, song title, source location, genre, artist, album, time remaining in song, or other song information), and signal strength. Other display technologies, such as field emission displays, plasma displays, and cathode ray tube displays may be implemented. The remote interface 123 may be implemented by a touch screen, button panel, wired interface, an infrared (IR) or a Bluetooth interface, or a haptic interface. The remote interface 123 may allow a user to interact with the HD radio system 100, such as to change a channel, volume, select information to display, or configure the HD radio system 100.

The transceiver 105 may also include a storage 108 that may be configured to store buffered radio signals that may be processed by the processor 107 from the HD radio signal 102 for later output, processing, or transmission to other modules within the HD radio system 100 or external to the HD radio system 100. Alternatively, the transceiver 105, the processor 107, and the storage 108 may be implemented as separate modules. The storage 108 may include volatile storage such as dynamic random access memory (DRAM), static random access memory (SRAM), non-volatile memory such as flash memory and electronically eraseable memory (EEPROM), solid-state memory such as a hard disk drive, and disc-based media such as compact disc (CD), digital versatile disc (DVD), or floppy disk.

Figure 2:
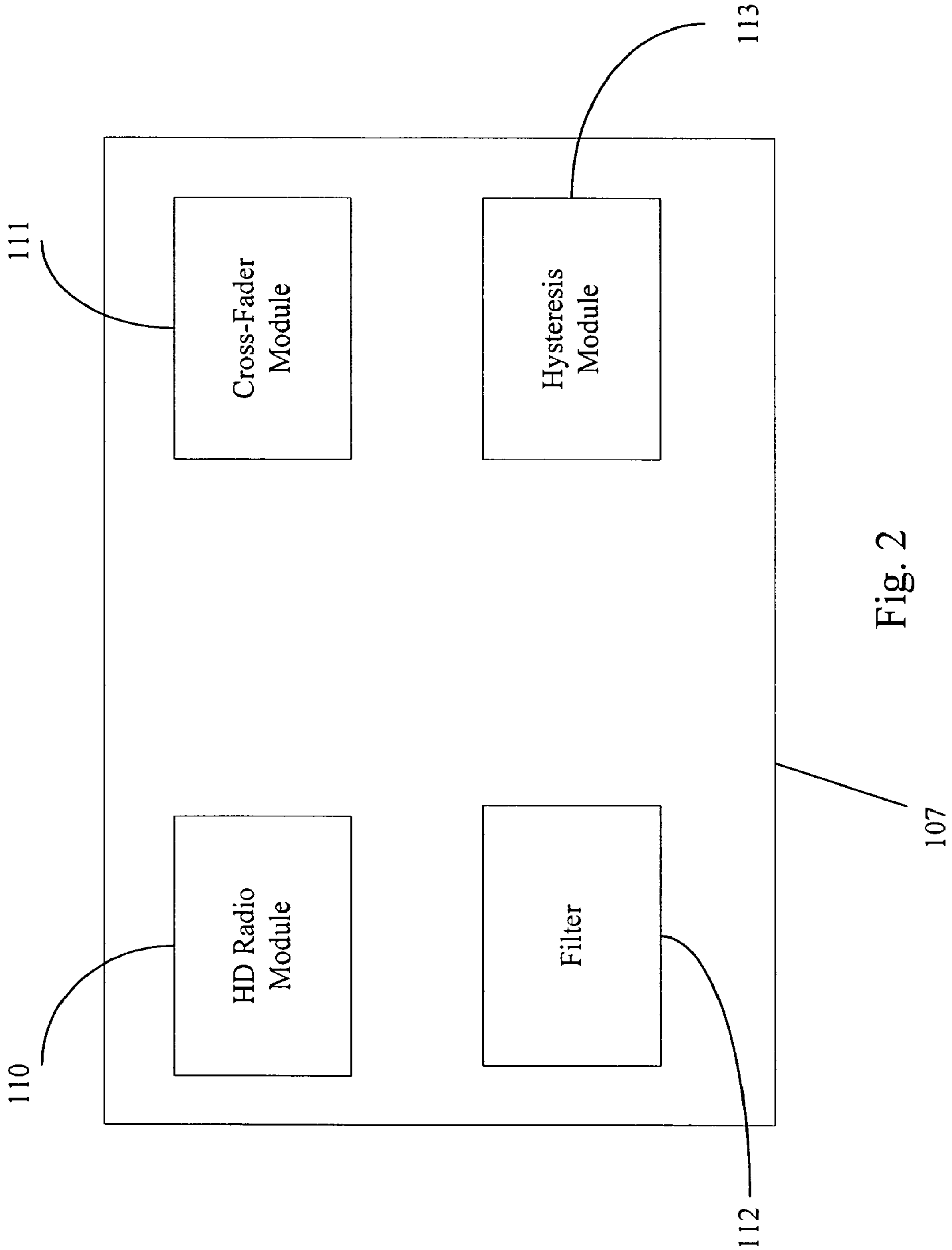
FIG. 2 illustrates an example high definition radio tuner.

FIG. 2 illustrates an example block diagram of the HD radio processor 107. The HD radio processor 107 may include an HD radio module 110. The HD radio module 110 may process digital information contained in the sidebands of the HD radio signal 102 to determine signal characteristics, such as frequency properties, digital signal presence in the HD radio signal 102, or other signal parameters. The HD radio module 110 may be implemented by a digital signal processor, for example.

The HD radio processor 107 may include a cross-fader module 111. The cross-fader module 111 may be operative to blend an analog signal to a digital signal, and to blend a digital signal to an analog signal. The blending process may include diminishing the analog/digital signal output to a loudspeaker while increasing the respective digital/analog signal output to the loudspeaker smoothly at the same time. A listener may perceive little change in signal output as a result. The cross-fader module 111 may include volume and frequency compensation circuitry or logic, such as filters, Fourier transforms, amplifiers, comparators, frequency shifters, expanders, and other digital signal processing components.

The HD radio processor 107 may include a filter bank 112. The filter bank 112 may be configured as a bandpass filter, a high-pass filter, a low-pass filter, or other filter(s). The. filter bank 112 may isolate and process frequency components of the HD radio signal 102 to modify the signal characteristics of the HD radio signal 102. The filter bank 112 may increase or decrease the signal bandwidth, and/or increase or decrease the amplitude of determined frequency components of a signal.

The HD radio processor 107 may include a hysteresis module 113. The hysteresis module 113 may "lock-in" an analog component of the HD radio signal 102 when a digital component is not detected in the HD radio signal 102. The hysteresis module 113 may provide timing, latch and hold circuitry, or filter components to provide the analog component as an output signal to a loudspeaker, and exclude transitions to other signal components for a determined period of time.

The HD radio processor 107 may be implemented as a microprocessor, digital signal processor (DSP), microcontroller, discrete integrated circuit, network appliance, an application specific integrated circuit (ASIC), a field programmable gate array (FPGA) device, a custom integrated circuit, or other electronic circuit device. The cross-fader module 111 may include a microprocessor, a microcontroller, an ASIC, an FPGA, a custom integrated circuit, or logic such as algorithms, routines, or programs.

Figure 3:
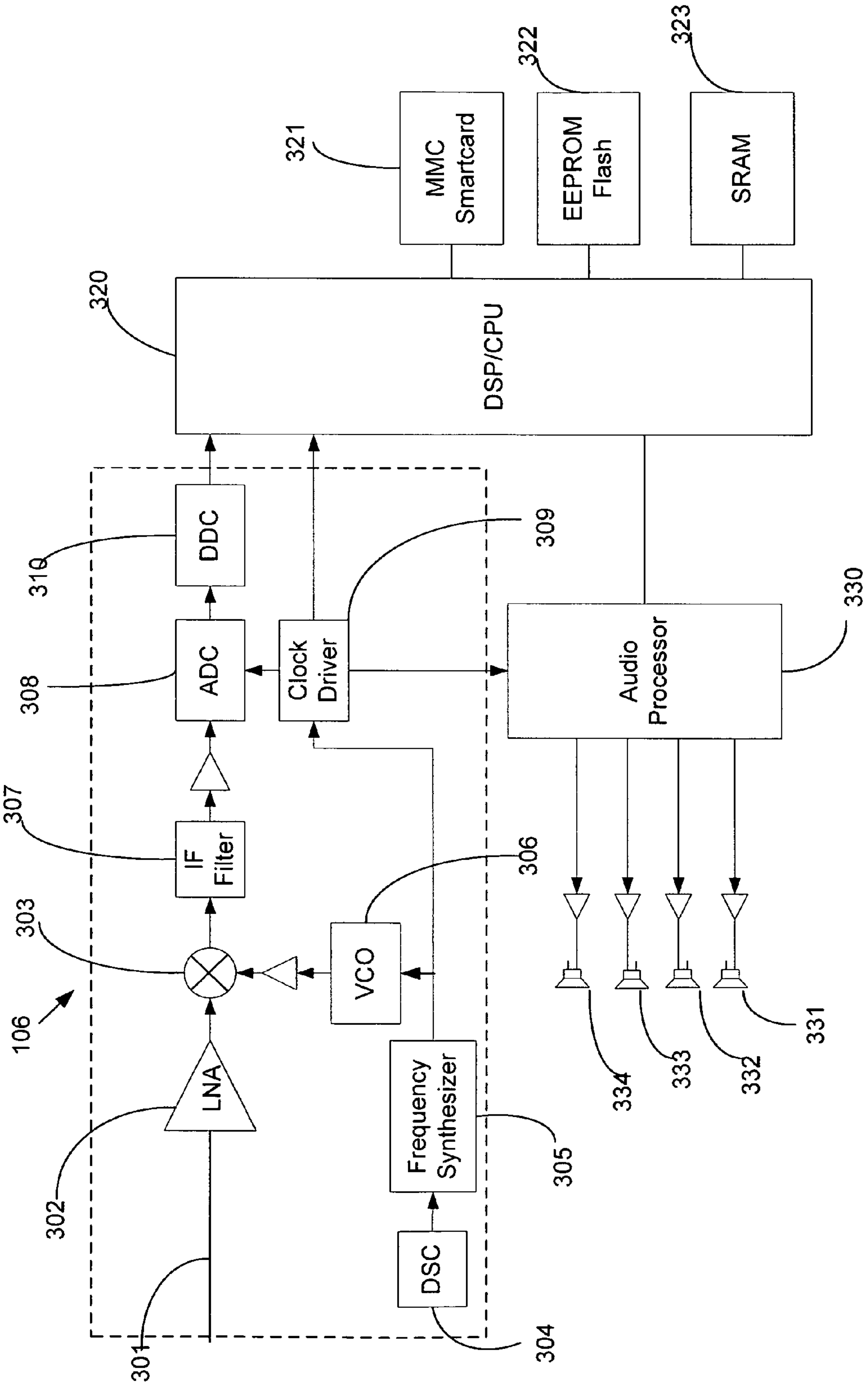
FIG. 3 illustrates an example high definition transceiver.

FIG. 3 illustrates an example block diagram of components of the transceiver 105. The tuner 106 may include analog front end components configured to process an input signal 301, such as the HD radio signal 102. A low noise amplifier (LNA) 302 may boost the RF signal of the input signal 301 and supply the output to a mixer 303. A frequency synthesizer 305 may receive a digital source clock (DSC) 304 signal, and provide the clock signal output to a voltage controlled oscillator (VCO) 306 and a clock driver 309. The output of the VCO 306 may be mixed with the output of the LNA 302 at the mixer 303, and then supplied to an intermediate frequency (IF) filter 307. An analog-to-digital converter (ADC) 308 may convert analog RF signals to a digital signal output that is provided to a digital down converter (DDC) 310. The DDC 310 may provide down conversion, digital mixing, and/or decimation filtering to provide baseband in-phase (I) and quadrature (Q) output signals to a digital signal processor/central processing unit (DSP/CPU) 320. The ADC 308 may receive a clock output signal from the clock driver 309. The clock driver 309 may also supply the clock signal to the DSP/CPU 320. Any of the components described in FIG. 3 may be implemented by integrated circuit or discrete components adapted to process a hybrid digital radio signal.

The DSP/CPU 320 may receive input from memory modules, such as a multimedia smartcard (MMC) 321, an EEPROM Flash 322, or a static random access memory (SRAM) 323. The MMC Smartcard 321, the EEPROM Flash 322, or the SRAM 323 may provide data, such as digital media, playlists, configuration or initialization parameters, or other data to configure and operate the DSP/CPU 320. The memory modules (321, 322, and 323) may provide source code or other logic executable by the DSP/CPU 320. The DSP/CPU 320 may perform I/Q demodulation and output of a processed digital signal to an audio processor 330. The DSP/CPU 320 may also control a user interface, a bus interface, or a network interface (not shown). The DSP/CPU 320 may be implemented as a DSP, an integrated circuit, an ASIC, an FPGA, a microcontroller, a network appliance, or a network server. The DSP/CPU 320 may be implemented as computer-readable code or software operable on a processor as described above.

The audio processor 330 may receive an input(s) from the clock driver 309 in the form of a clock signal. The audio processor 330 may provide an audio output signal that drives one or more audio loudspeakers (331, 332, 333, and 334). The audio processor 330 may be configured to perform the functions described in FIG. 2 in relation to the HD radio module 110, the cross-fader module 111, the filter bank 112, and/or the hysteresis module 113. Alternatively, the DSP/CPU 320 may be configured to perform the functions of the HD radio module 110, the cross-fader module 111, the filter bank 112, and/or the hysteresis module 113. The audio processor 330 may be implemented as a DSP, an integrated circuit, an ASIC, an FPGA, a microcontroller, a network appliance, or a network server. The audio processor 330 may be implemented as computer-readable code or software operable on a processor as described above.

Figure 4:
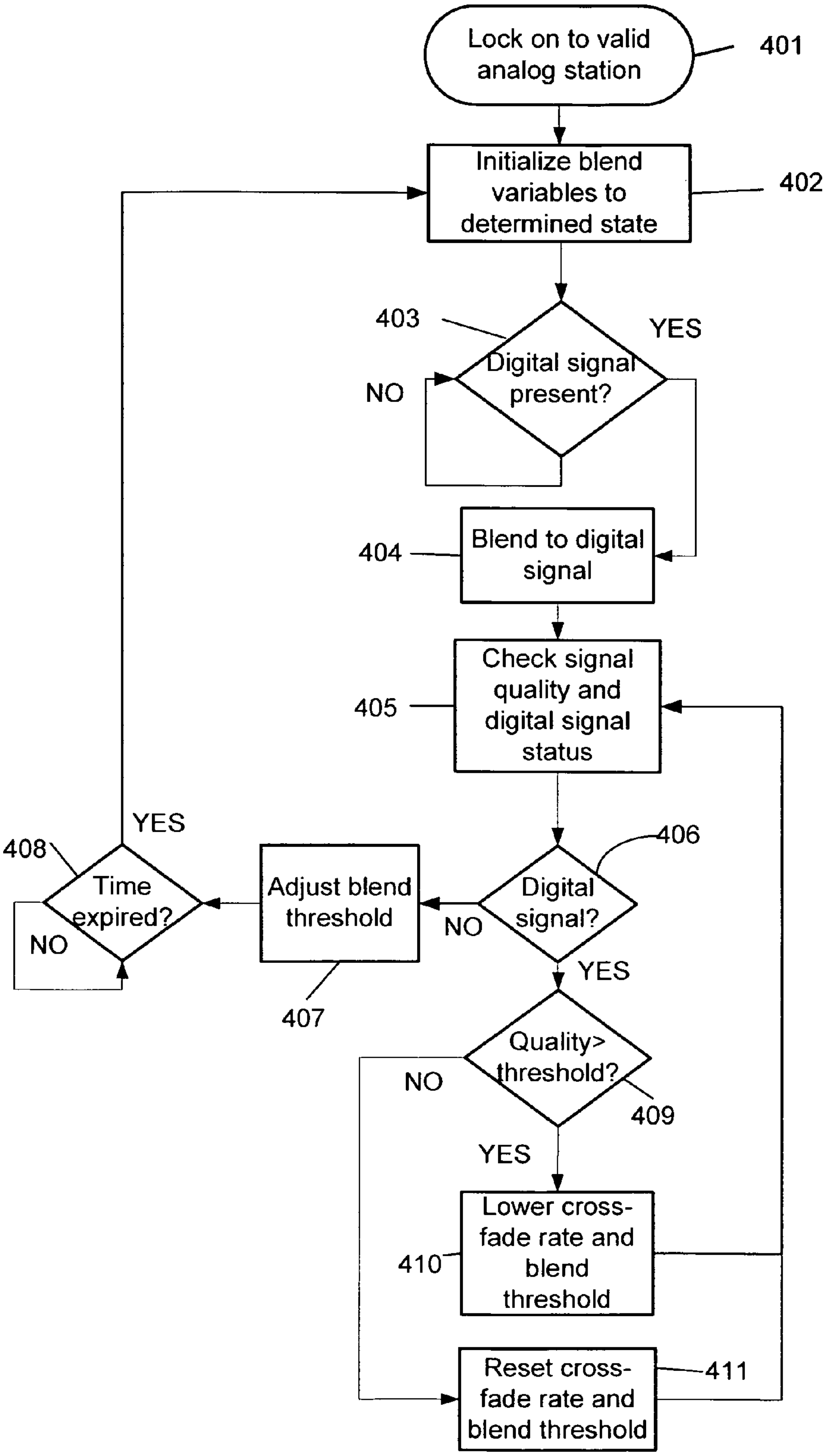
FIG. 4 illustrates an example process that blends a frequency modulation hybrid digital radio signal.

FIG. 4 illustrates example interrelated acts taken to blend an output from component a hybrid radio signal. Any of the components of the transceiver 105 illustrated in FIGS. 1-3 may perform any of the acts illustrated in FIG. 4. In some systems, an FM radio signal, such as an IBOC frequency modulation (FM) radio signal may be transmitted by transmitter 101. An FM digital radio signal transceiver may encounter difficulties maintaining a lock on the digital signal because of varying terrain, building interference, weather conditions, or other ambient spatial and environmental features. Consequently, a receiver may be forced to switch back and forth from an analog component to a digital component of the HD radio signal 102, with resulting changes in loudness or sound quality. The transceiver 105 receives the HD radio signal 102, at block 401. The HD radio signal 102 may include at least one of an analog radio signal or a digital radio signal. The transceiver 105 may lock onto the analog radio signal if the analog radio signal is present in the HD radio signal 102, at block 401.

The transceiver 105 may initialize blend variables to a determined state, at block 402. The transceiver 105 may set the blend variables prior to system operation, such as by initializing a memory address, setting a pointer, or filling a cache with blend variable data. The blend variables may be loaded from a memory address. The transceiver 105 may also determine the blend variables during system operation, based on operational characteristics and signal reception characteristics, such as signal quality, signal strength, signal frequency characteristics or other parameters. Examples of blend variables include a cross-fade time for fading between signal components, and a blend threshold. The cross-fade time may be set based on an acceptable transition period between the analog and digital components, such as approximately on the order of milliseconds, so that a user does not perceive an abrupt or noticeable transition. A determined state of the blend variables may include a cross-fade time or a blend threshold based on factory-set or user input parameters. The determined blend variables may be stored in the storage 108.

The blend threshold may be determined when reception conditions deteriorate to the point where a determined percentage, such as approximately 10 percent, of the data blocks sent in the digital sidebands of the HD radio signal 102 are corrupted during transmission. Other blend thresholds are possible according to the design and application circumstances. The blend threshold may be determined by simulations or empirical observations of radio signal blending and signal quality perception. Alternatively, the blend threshold may be automatically determined during system operation, based on system performance or user input.

The transceiver 105 may determine if the HD radio signal 102 contains a digital radio signal, at block 403. If the HD radio signal 102 contains a digital radio signal, the transceiver 105 may blend a transceiver output from the analog signal to the digital signal, at block 404. The HD radio module 110 may be configured to process a blend line provided by the transceiver 105. Blending may be performed by reading the blend line signal, such as a high to low blend signal transition, with the HD radio module 110 in the transceiver 105. The blend line may be based on the blend threshold. The HD radio processor 107 may decide that a determined number of data blocks have been successfully received and processed, indicating the presence of an acceptable digital signal. The HD radio module 110 may interpret the blend line to initiate the cross-fader module 111 to blend the signal from an analog radio signal to a digital radio signal. The cross-fader module 111 may compensate the signal for volume and frequency parameters to blend the signal, such as by ramping the signal volume as the analog signal is blended to the digital signal, over a fixed time period on the order of milliseconds, or during a determined time period. If the transceiver 105 fails to determine that a digital signal is present, the transceiver 105 may remain locked to the analog signal in the hybrid radio signal 102, and may continue attempting to acquire a digital signal, at block 403.

The transceiver 105 may determine one or more hybrid digital radio signal quality parameters and one or more digital radio signal quality parameters (if a digital signal is detected at block 403), at block 405. The hybrid radio signal quality parameter and the digital radio signal quality parameter may include parameters from the HD radio module 110, such as status messages indicating the quality or signal integrity of the received radio signals, for example.

The transceiver 105 may process the hybrid radio signal if the digital radio signal is not present in the HD radio signal 102, as determined at block 406. The transceiver 105 may adjust the blend threshold, at block 407, such as by decreasing the determined number of successful data blocks required for digital acquisition. The transceiver 105 may enter a hysteresis mode through the hysteresis module 113, at block 408, where the transceiver 105 remains in analog mode, outputting the analog radio signal, for a determined time period. When in hysteresis mode, the transceiver 105 may disable or suspend digital radio signal reception capabilities, maintain the analog radio signal volume and/or frequency settings, and/or filter out digital signal components from the HD radio signal 102. The transceiver 105 may not try to determine a digital signal presence until the determined time period expires. After the determined time period expires, the transceiver 105 then returns to block 402.

If the digital radio signal is present in the HD radio signal 102, at block 406, and at least one digital radio signal quality parameter is greater than a determined threshold, at block 409, the transceiver 105 may process the digital radio signal, at block 410. The transceiver 105 may adjust the cross-fade rate and the blend threshold, such as by lowering these variables by a determined amount in terms of percentage of maximum value, slew rate or ramp rate, or by absolute value amounts. The determined amount may be set by the system designer, at system installation, by user input, or dynamically adjusted by the transceiver, based on system operation and signal quality. The transceiver 105 then may repeat the radio signal quality checks of block 405 iteratively. If the digital radio signal is present in the HD radio signal 102 and the digital radio signal quality parameter is less than the determined threshold, at block 409, the transceiver 105 may adjust the cross-fade rate and the blend threshold, at block 411, such as by re-setting these variables to default, determined values. The transceiver 105 then returns to block 405 to repeat the radio signal quality checks.

Figure 5:
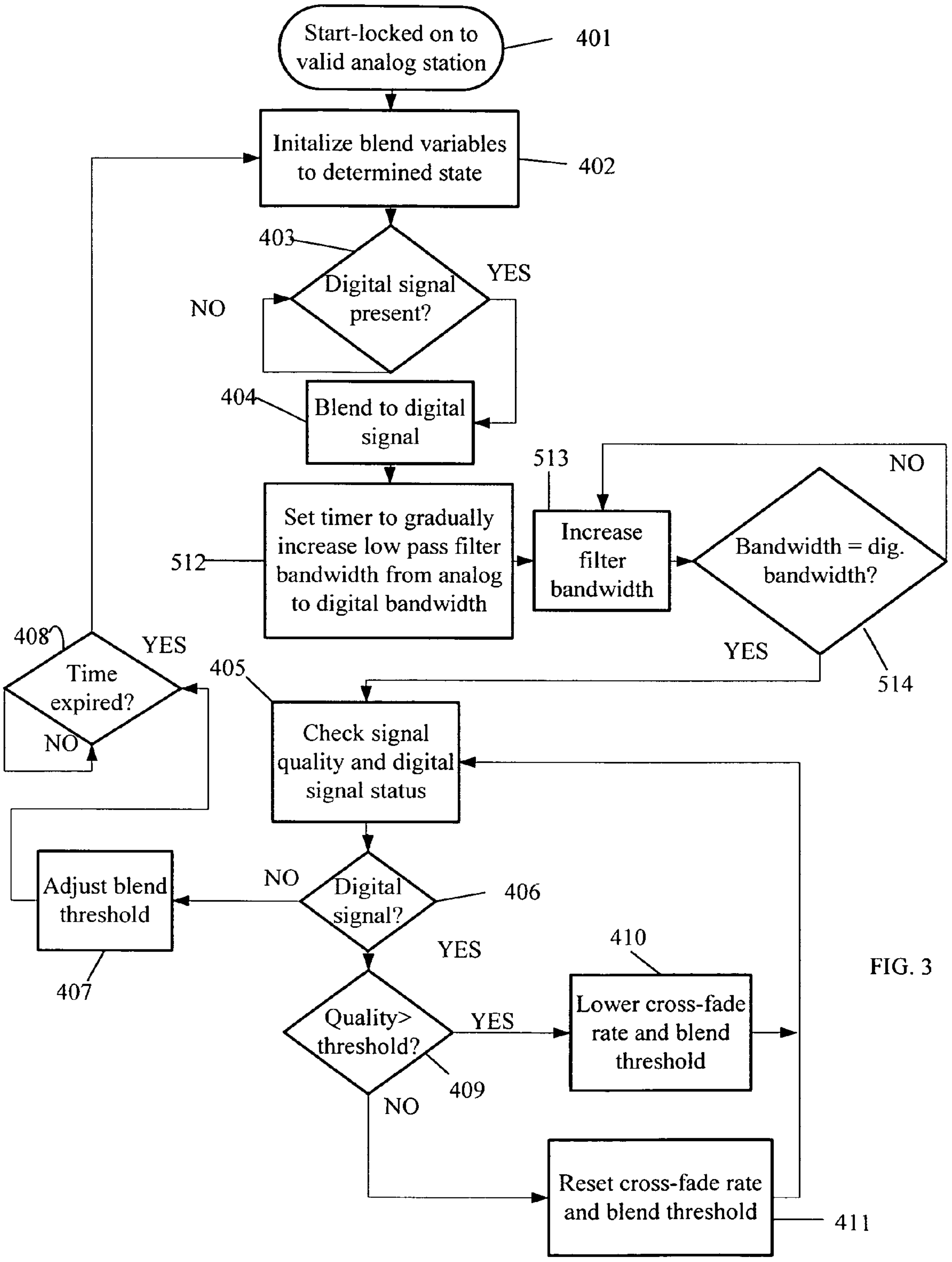
FIG. 5 illustrates an example process that blends an amplitude modulation hybrid digital radio signal.

FIG. 5 illustrates example interrelated acts that blend an output component of a hybrid radio signal, such as IBOC AM radio signal. Any of the components of the transceiver 105 illustrated in FIGS. 1-3 may perform any of the acts described in FIG. 5. Digital AM signals may encounter similar problems in signal reception and tuning as FM digital signals. Digital AM signals may experience changes in sound level as a result of blending from an analog AM signal to a digital AM signal, which may be noticeable to the user as an abrupt transition. Digital AM signals also may experience frequency expansion of the signal as well, in which frequency components that were not present in the limited bandwidth analog AM signal are perceived by the user. This may affect the sound quality for the user.

For an AM signal, the transceiver 105 may perform the same acts described in FIG. 4 up to block 404. After block 404, when the transceiver 105 may blend from an analog AM signal to a digital AM signal, the transceiver 105 may adjust a filter bandwidth from an analog bandwidth to a digital bandwidth, at block 512, using the filter bank 112. The filter may be a lowpass filter, for example. The transceiver 105 may set a timer to gradually increase the filter bandwidth from an analog bandwidth (such as approximately 5 kHz) to a determined digital bandwidth (such as approximately 15 kHz) over a determined period, such as a few seconds. In one example, the transceiver 105 may increase the filter bandwidth over a 4 ½ second delay present between the analog and digital signal components of the HD radio signal 102, or may use a shorter or longer time period. The transceiver 105 may increase the filter bandwidth, at block 513, while the timer is incremented. The transceiver 105 then determines if the filter bandwidth is substantially equal to the digital bandwidth, at block 514. If the filter bandwidth is substantially equal to the digital bandwidth, the process continues with block 405 and continues with the same process as illustrated in FIG. 4. If the filter bandwidth is not equal to the digital bandwidth, the transceiver 105 continues to increase the filter bandwidth, at block 513.

The example processes shown in FIGS. 4 and 5 may be implemented in a vehicle audio system. The vehicle audio system may include a digital radio system such as an HD radio-configured radio system. The system illustrated in FIG. 1 may be incorporated into a vehicle as well, such as in a vehicle head unit. The system 100 may also be configured for use in a building, such as a home environment. The components (106, 107, and 108) illustrated in FIG. 1 may be integrated into a single unit, or may function as separate components within the transceiver 105.

The sequence diagrams shown in FIGS. 4-5 may be encoded in a signal bearing medium, a computer readable medium such as a memory, programmed within a device such as one or more integrated circuits, or processed by a controller or a computer. If the methods are performed by software, the software may reside in a memory resident to or interfaced to the transceiver 105, a communication interface, or any other type of non-volatile or volatile memory interfaced or resident to the transceiver 105. The memory may include an ordered listing of executable instructions for implementing logical functions. A logical function may be implemented through digital circuitry, through source code, through analog circuitry, or through an analog source such as through an analog electrical, audio, or video signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable medium," "machine-readable medium," "propagated-signal" medium, and/or "signal-bearing medium" may comprise any unit that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM" (electronic), a Read-Only Memory "ROM" (electronic), an Erasable Programmable Read-Only Memory (EPROM or Flash memory) (electronic), or an optical fiber (optical). A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method for blending a radio signal comprising:

receiving a hybrid radio signal with a transceiver, the hybrid signal including an analog radio signal and a digital radio signal;

determining presence of the digital radio signal in the hybrid radio signal;

blending from the analog radio signal to the digital radio signal with the transceiver when the analog radio signal and the digital radio signal are both present in the hybrid radio signal;

setting an analog mode for a predetermined period of time with the transceiver when the digital radio signal is not present in the hybrid radio signal, where, based on the digital radio signal not being present in the hybrid radio signal, the transceiver suspends determining the presence of the digital radio signal in the hybrid radio signal during the predetermined period of time;

after the analog mode is set, determining a digital radio signal quality parameter with the transceiver;

resuming, after expiration of the predetermined period of time, the determining the presence of the digital radio signal in the hybrid radio signal; and processing the digital radio signal with the transceiver when the digital radio signal is present in the received hybrid radio signal upon expiration of the predetermined period of time and the digital radio signal quality parameter is greater than a determined threshold.

2. The method of claim 1 further comprising:

locking onto the analog radio signal with the transceiver; and setting blend variables to a determined state with the transceiver.

3. The method of claim 2 where setting blend variables comprises setting a cross-fade time parameter and a blend threshold with the transceiver.

4. The method of claim 3 where setting an analog mode comprises:

adjusting the blend threshold with the transceiver during receipt of the hybrid radio signal;

determining if the digital radio signal is present after the predetermined period of time with the transceiver; and blending to the digital radio signal when the digital radio signal is present after the predetermined period of time with the transceiver.

5. The method of claim 3 where processing the digital radio signal comprises:

adjusting the cross-fade time parameter and the blend threshold with the transceiver when the digital radio signal quality parameter is greater than the determined threshold; and resetting the cross-fade time parameter and the blend threshold with the transceiver when the digital radio signal quality parameter is less than the determined threshold.

6. The method of claim 1 where the hybrid radio signal comprises a frequency modulation (FM) radio signal.

7. The method of claim 6 where the FM radio signal comprises an in-band on-channel (IBOC) FM radio signal.

8. The method of claim 6 where the hybrid radio signal comprises a high definition radio signal.

9. The method of claim 1 further comprising blending the digital radio signal to the analog radio signal with the transceiver when the digital radio signal is no longer present after blending to the digital radio signal.

10. A method for blending a radio signal comprising:

receiving a hybrid radio signal with a transceiver, the hybrid signal including an analog radio signal and a digital radio signal;

blending from the analog radio signal to the digital radio signal with the transceiver when the analog radio signal and the digital radio signal are both present in the hybrid radio signal;

adjusting a filter bandwidth from an analog bandwidth to a digital bandwidth;

setting an analog mode for a predetermined period of time with the transceiver when the digital radio signal is not present in the hybrid radio signal, where, in response to the digital radio signal not being present in the hybrid radio signal, the transceiver suspends at least one digital radio signal reception capability during the predetermined period Of time;

after the analog mode is set, determining a digital radio signal quality parameter with the transceiver;

determining presence of the digital radio signal in the hybrid radio signal after expiration of the predetermined period of time; and processing the digital radio signal with the transceiver in response to presence of the digital signal in the hybrid signal upon expiration of the predetermined period of time and the digital radio signal quality parameter being greater than a determined threshold.

11. The method of claim 10 further comprising:

locking onto the analog radio signal with the transceiver when the analog radio signal is present in the hybrid radio signal; and setting a plurality of blend variables to determined states with the transceiver.

12. The method of claim 11, where setting the plurality of blend variables comprises setting a cross-fade time parameter and a blend threshold with the transceiver.

13. The method of claim 12:

adjusting the blend threshold with the transceiver during receipt of the hybrid radio signal; and blending from the analog radio signal to the digital radio signal with the transceiver when the digital radio signal is present after the predetermined period of time.

14. The method of claim 12 where processing the digital radio signal comprises:

adjusting the blend threshold with the transceiver when the digital radio signal quality parameter is greater than the determined threshold; and resetting the cross-fade time parameter and the blend threshold with the transceiver when the digital radio signal quality parameter is less than the determined threshold.

15. The method of claim 10 where adjusting a filter bandwidth comprises:

setting a timer with the transceiver to increase the filter bandwidth from the analog bandwidth to the digital bandwidth; and increasing the filter bandwidth with the transceiver from the analog bandwidth to the digital bandwidth.

16. The method of claim 15 where the filter bandwidth comprises a low pass filter bandwidth.

17. The method of claim 10 where adjusting a filter comprises:

determining if the filter bandwidth is substantially equal to the digital bandwidth with the transceiver; and increasing the filter bandwidth with the transceiver when the filter bandwidth is not substantially equal to the digital bandwidth.

18. The method of claim 10 where the hybrid radio signal comprises an amplitude modulation (AM) radio signal.

19. The method of claim 18 where the AM radio signal comprises an in-band on-channel (IBOC) AM radio signal.

20. The method of claim 10 where the hybrid radio signal is a high definition (HD) radio signal.

21. The method of claim 10 further comprising blending from the digital radio signal to the analog radio signal with the transceiver if the digital radio signal is no longer present after blending to the digital radio signal.

22. A system for blending a radio signal comprising:

a transceiver operable to receive a hybrid radio signal, where the hybrid radio signal includes an analog radio signal and a digital radio signal; and a processor operable to:

determine presence of the digital radio signal in the hybrid radio signal;

blend from the analog radio signal to the digital radio signal when the digital radio signal becomes present in the hybrid radio signal;

set the transceiver to an analog mode for a predetermined period of time if the digital radio signal is not present, where, during the predetermined period of time, the processor filters out at least one digital radio signal component when the digital signal radio component is present in the hybrid radio signal;

determine a digital radio signal quality parameter; and process the digital radio signal in response to presence of the digital signal in the hybrid signal upon expiration of the predetermined period of time and the digital radio signal quality parameter being greater than a determined threshold.

23. The system of claim 22 where the hybrid radio signal comprises a frequency modulation (FM) radio signal.

24. The system of claim 23 where the processor is further operable to blend the digital radio signal to the analog radio signal if the digital radio signal ceases to be present after blending to the digital radio signal.

25. A system for blending a radio signal comprising:

a transceiver operable to receive a hybrid radio signal, where the hybrid radio signal includes an analog radio signal and a digital radio signal; and a processor operable to:

determine presence of the digital radio signal in the hybrid radio signal;

blend from the analog radio signal to the digital radio signal when the digital radio signal is present in the hybrid radio signal;

adjust a filter bandwidth from an analog bandwidth to a digital bandwidth;

set the transceiver to an analog mode for a predetermined period of time, where, based on the digital radio signal not being present in the hybrid radio signal, the processor suspends determining the presence of the digital radio signal in the hybrid radio signal during the predetermined period of time;

determine a digital radio signal quality parameter;

resume, after expiration of the predetermined period of time, the determination of presence of the digital radio signal in the hybrid radio signal; and process the digital radio signal after expiration of the predetermined period of time when the digital radio signal is present in the hybrid radio signal and the digital radio signal quality parameter is greater than a determined threshold.

26. The system of claim 25 further comprising a filter.

27. The system of claim 26 where the filter comprises a low-pass filter.

28. The system of claim 27 further comprising logic operable to determine if the filter bandwidth is substantially equal to the digital bandwidth, where the logic adjusts the filter bandwidth if the filter bandwidth is not substantially equal to the digital bandwidth.

29. The system of claim 25 where the hybrid radio signal comprises an amplitude modulation (AM) radio signal.

* * * * *